United States Patent
Uwasawa

[19]

[11] Patent Number: 6,057,217
[45] Date of Patent: *May 2, 2000

[54] PROCESS FOR PRODUCTION OF SEMICONDUCTOR DEVICE WITH FOREIGN ELEMENT INTRODUCED INTO SILICON DIOXIDE FILM

[75] Inventor: Kenichi Uwasawa, Tokyo, Japan

[73] Assignee: NEC Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/896,906

[22] Filed: Jul. 18, 1997

[30] Foreign Application Priority Data

Jul. 25, 1996 [JP] Japan ...................... 8-196190

[51] Int. Cl.$^7$ ................................ H01L 21/318
[52] U.S. Cl. .................... 438/585; 438/659; 438/216
[58] Field of Search ................... 438/585, 659, 438/281, 216

[56] References Cited

U.S. PATENT DOCUMENTS

| | | |
|---|---|---|
| 5,369,297 | 11/1994 | Kusunoki et al. . |
| 5,382,533 | 1/1995 | Ahmad et al. . |
| 5,516,707 | 5/1996 | Loh et al. . |
| 5,672,525 | 9/1997 | Pan ........................................ 438/591 |
| 5,683,924 | 11/1997 | Chan et al. ................................ 1/1 |
| 5,750,435 | 5/1998 | Pan ........................................ 438/525 |

FOREIGN PATENT DOCUMENTS

| | | |
|---|---|---|
| 0789400 | 8/1997 | European Pat. Off. . |
| 1272161 | 10/1989 | Japan . |
| 4062974 | 2/1992 | Japan . |
| 5-211330 | 8/1993 | Japan . |
| 5-343671 | 12/1993 | Japan . |
| 6-53232 | 2/1994 | Japan . |
| 6-151833 | 5/1994 | Japan . |
| 7-30113 | 1/1995 | Japan . |
| 7030113 | 1/1995 | Japan . |
| 7-147396 | 6/1995 | Japan . |
| 8-181309 | 7/1996 | Japan . |
| 8181229 | 7/1996 | Japan . |
| 8-316466 | 11/1996 | Japan . |
| 9-312393 | 12/1997 | Japan . |

OTHER PUBLICATIONS

T. Hori, "Inversion Layer Mobility under High Normal Field in Nitrided–Oxide MOSFET's", *IEEE Transactions on Electron Devices*, vol. 37, No. 9, Sep. 1990, pp. 2058–2069.

K. Uwasawa et al., "A New Degradation Mode of Scaled p+ Polysilicon Gate pMOSFETs Induced by Bias Temperature (BT) Instability", *IEDM 95*, pp. 871–874.

*Primary Examiner*—Charles Bowers
*Assistant Examiner*—Thanh Nguyen
*Attorney, Agent, or Firm*—Sughrue, Mion, Zinn, Macpeak & Seas, PLLC

[57] ABSTRACT

A MOS field effect transistor (MOSFET) comprising a semiconductor substrate 11 having thereon a gate silicon dioxide film 12 and a gate electrode 13 both formed by patterning, wherein in only at least one edge of gate lengthwise direction of the gate silicon dioxide film 12 is formed a region 14 containing an element (e.g. nitrogen) which is different from the elements constituting the silicon dioxide film and whose energy of bonding with silicon is larger than the energy of hydrogen-silicon bonding. In this MOSFET, the reliability reduction caused by the local degradation of the gate silicon dioxide film appearing at the edge of its lengthwise direction can be suppressed and, moreover, the property reduction can be suppressed.

5 Claims, 4 Drawing Sheets

(a)

(d)

(b)

(e)

(c)

(f)

PROCESS FOR PRODUCTION OF SEMICONDUCTOR DEVICE WITH FOREIGN ELEMENT INTRODUCED INTO SILICON DIOXIDE FILM

BACKGROUND OF THE INVENTION

1. Field of the Invention

The present invention relates to a semiconductor device and a process for production thereof. More particularly, the present invention relates to a MOS field effect transistor (hereinafter referred to as "MOSFET") having high reliability and a process for production thereof.

2. Description of the Related Art

Various production processes have heretofore been proposed in order to produce a finer and higher-performance semiconductor device.

FIG. 3 is a sectional view schematically showing the structure of a conventional MOSFET. Production of such a MOSFET is conducted by a process shown in FIG. 4. Firstly, a device-isolated structure (not shown in FIG. 4) is formed by subjecting a silicon substrate 31 to well-known local oxidation of silicon (LOCOS) or the like; then, a silicon dioxide film 32 is formed thereon as shown in FIG. 4(a). On the silicon dioxide film 32 is deposited a polysilicon 33 {FIG. 4(b)}. The resulting material is subjected to photolithography and etching, whereby the polysilicon 33 and the silicon dioxide film 32 undergo patterning and a gate polysilicon 35 and a gate silicon dioxide film 34 are formed {FIG. 4(c)}. Next, side wall spacers 37 are formed by the use of a silicon oxide insulating film as shown in FIG. 4(d). Impurity ion {ion of phosphorus, arsenic or the like in production of n-channel MOSFET and ion of boron, boron difluoride ($BF_2^+$) or the like in production of p-channel MOSFET} is implanted, whereby the gate polysilicon is doped and source/drain regions 38 are formed as shown in FIG. 4(e). Subsequent operations are ordinary wiring, etc., whereby a MOSFET is produced.

In a conventional MOSFET as shown in FIG. 3, the MOSFET is unable to have reliability when it contains, in the edge 41 of gate lengthwise direction of the gate silicon dioxide film 34, a large amount of dangling bonds {hereinafter referred to as "initial defect(s)"} which have been generated by the scission of the silicon-oxygen bond of silicon dioxide.

The reason is presumed to be as follows. In subjecting the polysilicon 33 and the silicon dioxide film 32 both shown in FIG. 4(b) to patterning to form a gate polysilicon 35 and a gate silicon dioxide film 34 as shown in FIG. 4(c), plasma etching is used generally. In this etching, with the progress of etching of the polysilicon 33, the silicon dioxide film 32 comes to be exposed to the plasma; thereby, the silicon dioxide film 32 is damaged physically by the ions, etc. present in the plasma, resulting in the scission of the silicon-oxygen bond in the silicon dioxide film 32. The initial defects of the gate silicon dioxide film 34 caused by such plasma damage are present locally in the gate lengthwise edge 41 of the gate silicon dioxide film 34, exposed to the plasma. In producing an integrated circuit using a MOSFET containing a large amount of initial defects, the initial defects react with hydrogen in the steps such as heat treatment in hydrogen, chemical vapor deposition of silicon oxide insulating film, or the like, to form a large amount of silicon-hydrogen bonds (hereinafter referred to as "hydrogen-related defects"). It is reported in, for example, 1995 Dec., IEEE international Electron Devices Meeting 1995, Technical Digest, pp. 871–874 that application of bias to the gate electrode of a MOSFET containing a large amount of hydrogen-related defects, in its temperature-elevated state {such a bias is called bias temperature stress (hereinafter referred to as "BT stress")} gives rise to the following phenomenon.

That is, when BT stress is applied to a MOSFET containing a large amount of hydrogen-related defects in the gate silicon dioxide film, the defects react with the holes electrochemically and there appear an electrically active interface state or fixed charges in the silicon dioxide film (the reaction is hereinafter referred to as "degradation reaction"), which brings about the fluctuation of MOSFET properties, particularly MOSFET threshold voltage. The hydrogen-related defects, which cause this property fluctuation, originate from initial defects; the initial defects are present locally in the gate lengthwise direction edge of gate silicon dioxide film, as mentioned previously; the degradation reaction proceeds locally in said edge; therefore, the degradation reaction, i.e., the property fluctuation of MOSFET becomes striking as the gate length becomes smaller. Further, the degradation reaction between hydrogen-related defects in gate silicon dioxide film and holes is more striking in p-channel MOSFET having holes in a large amount, than in n-channel MOSFET. Incidentally, a BT stress test is ordinarily conducted for examination of MOSFET reliability and screening of MOSFET. It is very important industrially in order to secure the reliability of MOSFET.

It is believed that introduction of nitrogen elements into initial defect-containing gate silicon dioxide film by heat treatment or the like and termination of the initial defects (dangling bonds) appearing in subsequent patterning, with the introduced nitrogen is effective to suppress the reduction in reliability of MOSFET. The process for production of semiconductor device, comprising such nitrogen introduction into gate silicon dioxide film has been used for obtaining a semiconductor device of higher performance and higher reliability, as described in, for example, IEEE Transactions on Electron Devices, Vol. 37, No. 9, September 1990, pp. 2058–2069.

In the above process for production of semiconductor device, the silicon dioxide film formed on the whole surface of a silicon substrate is heat-treated in ammonia and oxygen to introduce nitrogen into the whole portion of the silicon dioxide film. This conventional technique includes a problem of performance reduction of p-channel MOSFET.

The reason therefor is as follows. When nitrogen is introduced into the silicon dioxide film and then patterning is conducted to form a gate silicon dioxide film, there occurs, at the interface of the gate silicon dioxide film and the silicon substrate, an increase of the interface state density in the silicon band gap in the vicinity of the valence band; the holes in the channel (which are a conduction carrier of p-channel MOSFET) enter in or leave from the interface; as a result, the mobility of holes is reduced. Thus, when nitrogen is contained in the whole portion of the gate silicon dioxide film, the mobility of holes is reduced in the whole channel region below the gate electrode, resulting in reduction in current drivability and finally performance of p-channel MOSFET.

SUMMARY OF THE INVENTION

An object of the present invention is to provide a semiconductor device having high reliability, particularly a MOSFET having high reliability, and a process for production thereof. The present invention is further intended to increase the reliability of MOSFET and minimize the reduction in performance of MOSFET.

The present inventor made a study in order to achieve the above object. As a result, the present invention has been completed.

The present invention is directed to a semiconductor device comprising a semiconductor substrate having thereon at least a gate silicon dioxide film, wherein only at least one edge of gate lengthwise direction of the gate silicon dioxide film contains an element which is different from the elements constituting the silicon dioxide film and whose energy of bonding with silicon is larger than the energy of hydrogen-silicon bonding.

The present invention is also directed to a process for producing a semiconductor device, which comprises:

a first step of applying a silicon dioxide-made insulating film and an electrode material on a semiconductor substrate and removing the unnecessary portions of the insulating film and the electrode material to form a gate silicon dioxide film and a gate electrode, and a second step of introducing, into only at least one edge of gate lengthwise direction of the above-formed gate silicon dioxide film, an element which is different from the elements constituting the silicon dioxide film and whose energy of bonding with silicon is larger than the energy of hydrogen-silicon bonding.

In the present invention, only at least one edge of gate lengthwise direction of the gate silicon dioxide film of semiconductor device, particularly MOSFET is allowed to contain an element which is different from the elements constituting the silicon dioxide film and whose energy of bonding with silicon is larger than the energy of hydrogen-silicon bonding; thereby, initial defects of gate silicon dioxide film can be reduced and an increase in hydrogen-related defects in MOSFET production can be suppressed. As a result, fluctuation of MOSFET properties, etc. when stress (e.g. BT stress) is applied, can be alleviated and the high reliability of MOSFET can be secured.

Further, since the above-mentioned element capable of reducing the initial defects of the gate silicon dioxide film is not introduced into the whole region (below the gate electrode) where a channel is to be formed, but introduced into only at least one edge of gate lengthwise direction of the gate silicon dioxide film, the adverse effect of the above element on the interface between the gate silicon dioxide film and the silicon substrate can be suppressed; as a result, reduction in MOSFET performance can be suppressed.

DETAILED DESCRIPTION OF THE PREFERRED EMBODIMENTS

The present invention is described in more detail below with reference to the accompanying drawings.

Figure 1:
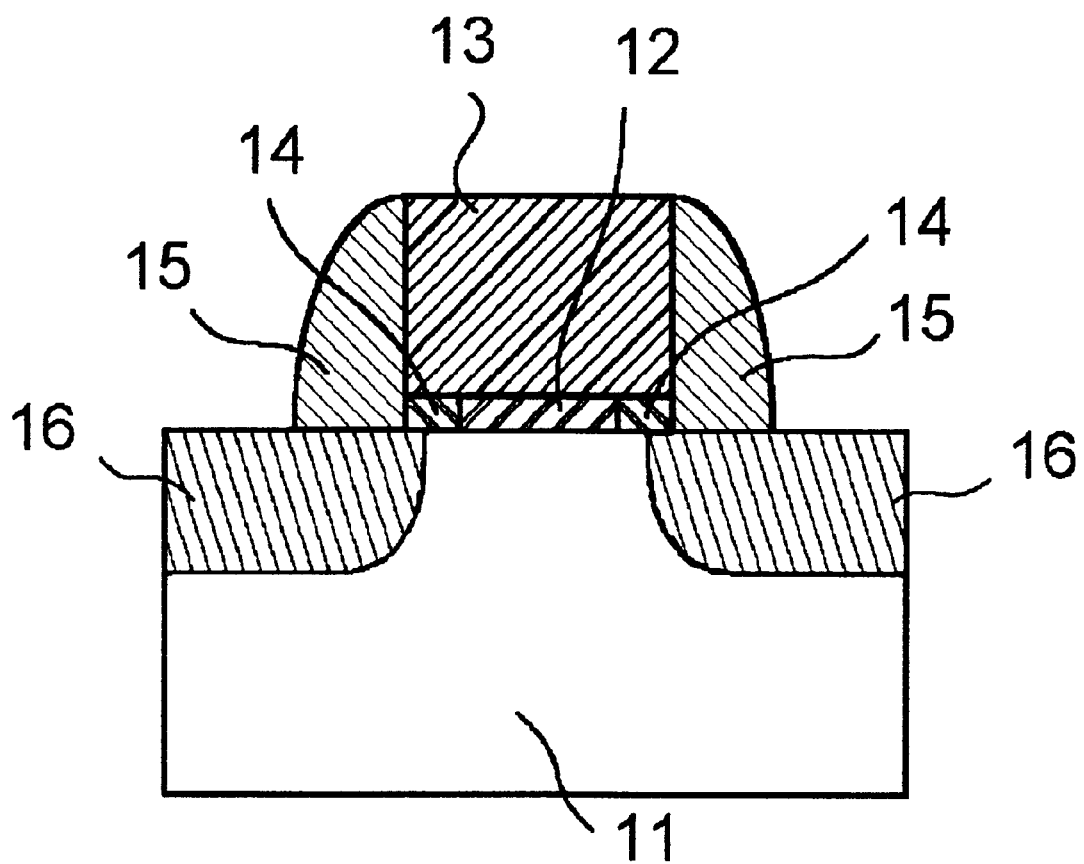
FIG. 1 is a schematic sectional drawing of a semiconductor device of the present invention.

FIG. 1 is a schematic sectional drawing of a semiconductor device which is one embodiment of the present invention. On a silicon substrate 11 are formed a gate silicon dioxide film 12 and a gate electrode 13. In only the gate lengthwise direction edges of the gate silicon dioxide film 12 are contained an element which is different from the elements constituting the silicon dioxide film 12 and whose energy of bonding with silicon is larger than the energy of hydrogen-silicon bonding, whereby regions 14 small in amount of initial defects are formed.

The gate silicon dioxide film 12 and the region 14 function as the gate insulating film of a MOSFET formed finally. In an ordinary MOSFET, nitrogen is the most suitable element for effective reduction of the initial defects present in the gate silicon dioxide film. The reason is that nitrogen forms a silicon-nitrogen bond which has a higher bonding energy than the silicon-hydrogen bond (hydrogen-related defect) has, which is chemically stable and which hardly gives rise to the previously-mentioned degradation reaction when stress (e.g. BT stress) is applied. Moreover, nitrogen can be easily introduced into the silicon dioxide film by various methods described later.

In FIG. 1, on the both sides of the gate electrode 13 are formed side wall spacers 15, and inside the silicon substrate 11 are formed source/drain regions 16. Since the region 14 which is small in initial defect amount is formed in the gate lengthwise direction edge of the silicon dioxide film 12, there hardly appear hydrogen-related defects in subsequent steps and, moreover, the termination of initial defects is conducted with an element having a larger energy of bonding with silicon than hydrogen does. Therefore, the degradation reaction between hydrogen-related defects and holes when stress (e.g. BT stress) is applied, is suppressed effectively. Furthermore, the element effective for initial defect reduction is not contained in most of the channel region right under the gate electrode 13 and is introduced into only the local region 14 of gate lengthwise direction edge. As a result, there is suppressed the reduction in MOSFET performance which is caused by the formation of new energy state by said element at the interface between the gate silicon dioxide film 12 and the semiconductor substrate 11. As previously mentioned, introduction of nitrogen into the whole portion of the silicon dioxide film (gate insulating film) causes reduction in the current drivability of p-channel MOSFET. On the other hand, formation of nitrogen-containing region at only the lengthwise direction edge of the gate silicon dioxide film as conducted in the present invention can suppress the above-mentioned reduction in MOSFET performance, caused by the introduction of nitrogen into the whole portion of the silicon dioxide film.

Figure 2:
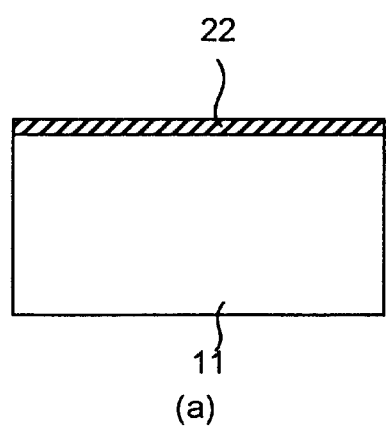
FIGS. 2(a) to 2(f) show each step of production of a semiconductor device of the present invention.
Figure 2:
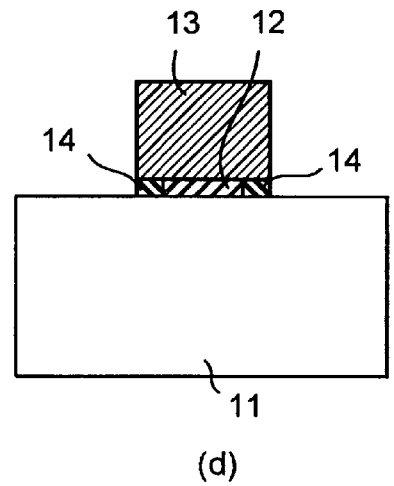
Figure 2:
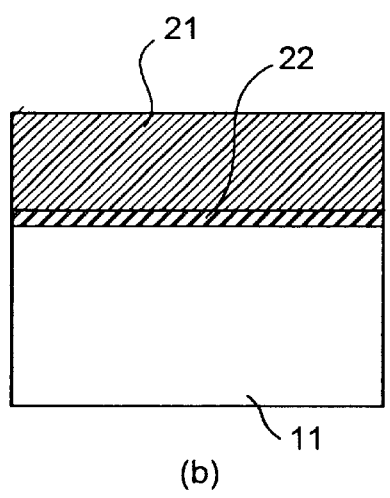
Figure 2:
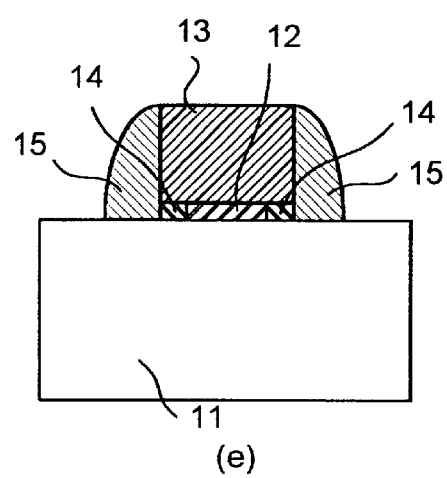
Figure 2:
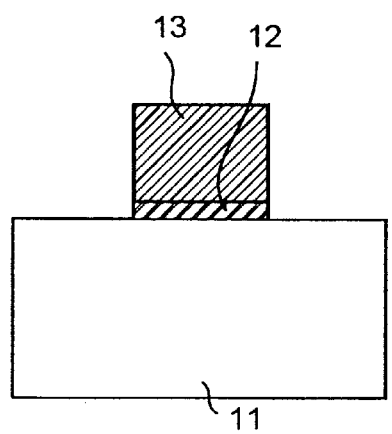
Figure 2:
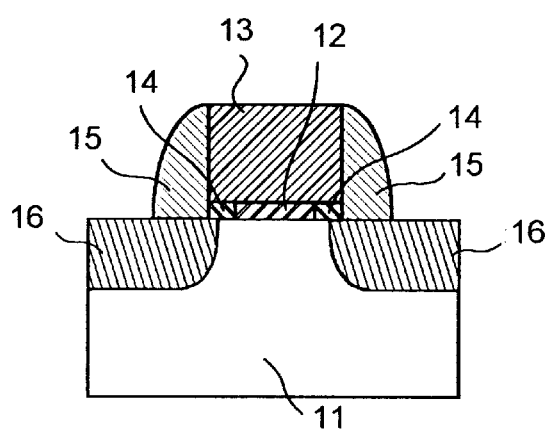
Figure 3:
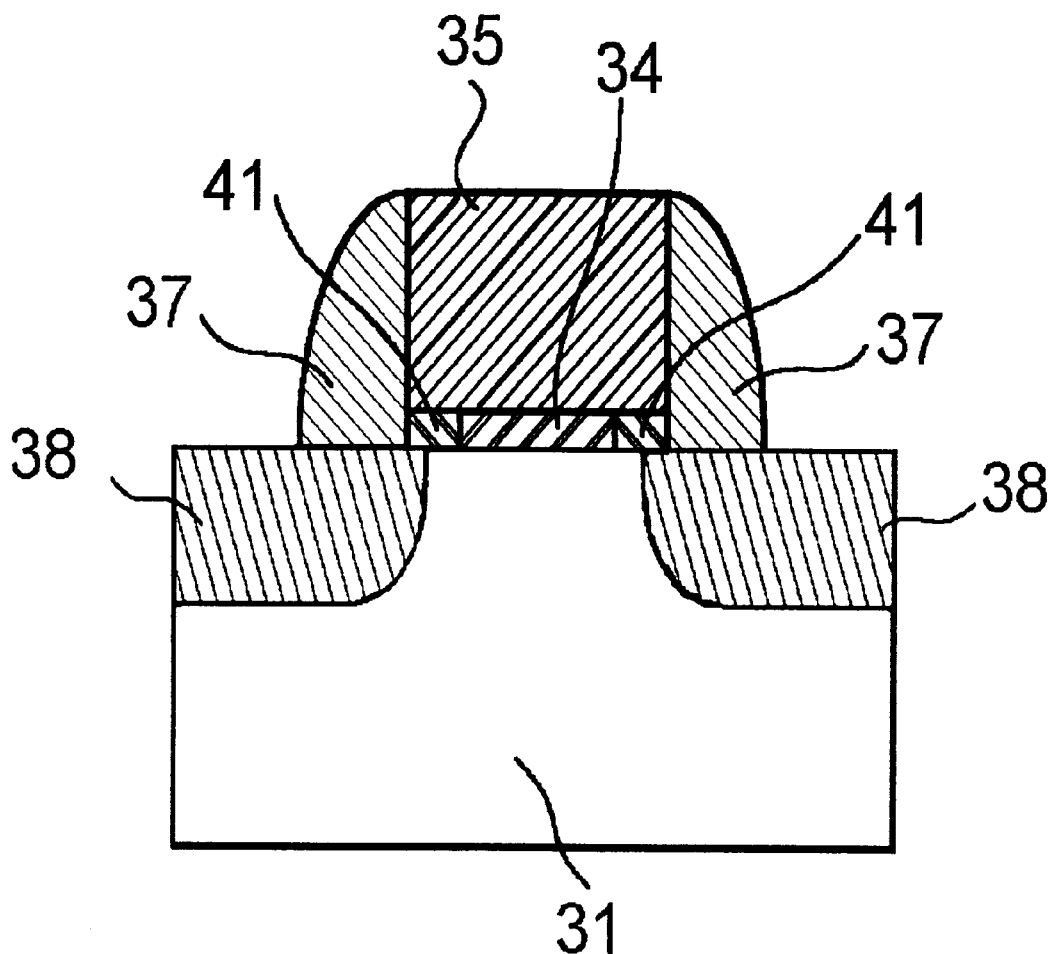
FIG. 3 is a schematic sectional drawing of a conventional semiconductor device.
Figure 4:
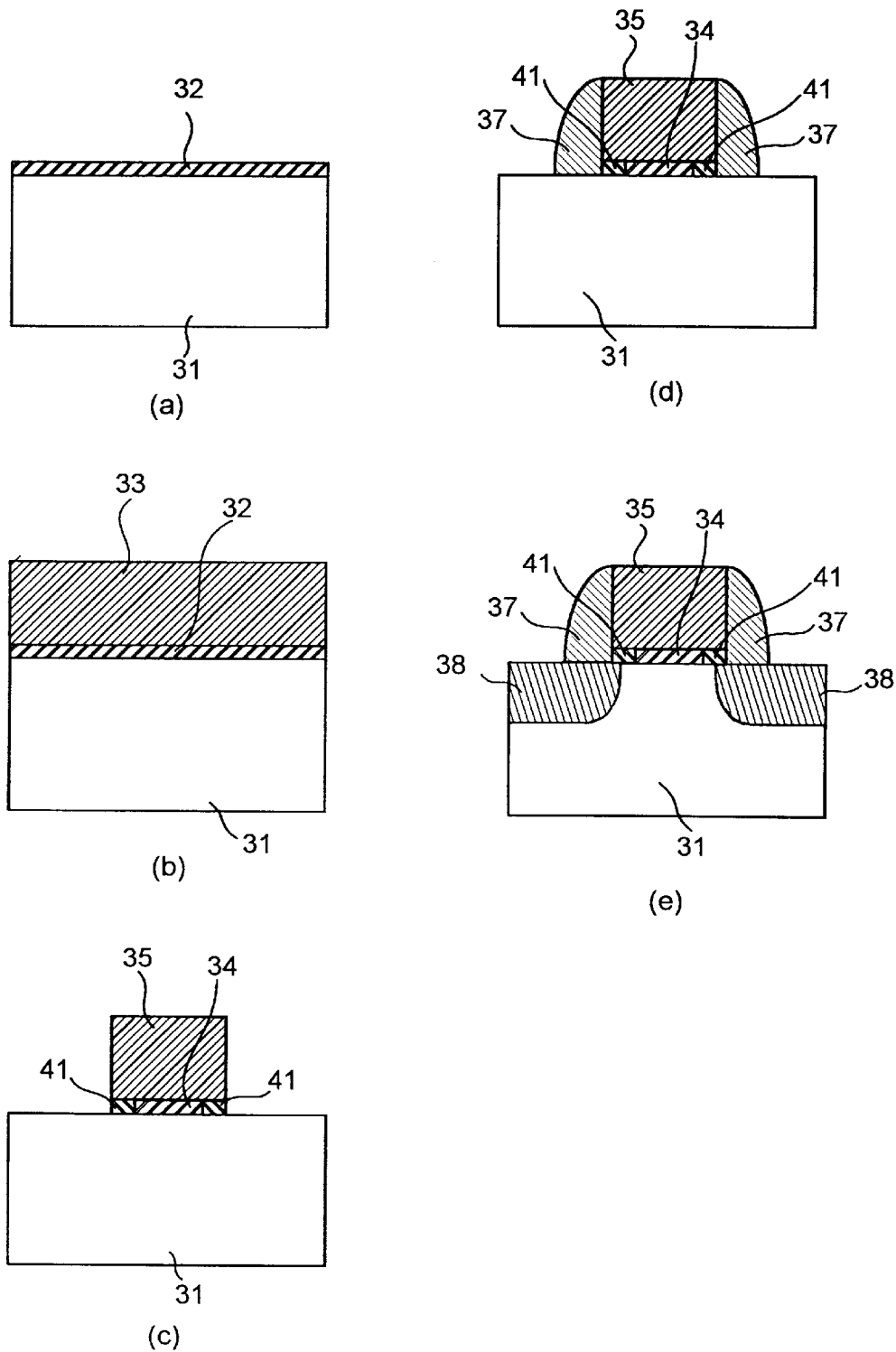
FIGS. 4(a) to 4(e) show each step of production of a conventional semiconductor device.

Next, the process for producing the semiconductor device of FIG. 1 is explained with reference to FIG. 2. Firstly, a silicon dioxide film 22 is formed uniformly on a silicon substrate 11, as shown in FIG. 2(a). On the whole surface of the silicon dioxide film 22 is deposited a gate electrode material 21 to form a structure as shown in FIG. 2(b). Then, lithography and etching are applied to conduct patterning so that the gate electrode material and the silicon dioxide film remain at required positions, whereby a gate electrode 13 and a gate silicon dioxide film 12 are formed as shown in FIG. 2(c). Thereafter, for example, a heat treatment is conducted in a gas containing an element which can terminate the initial defects present in the gate silicon dioxide film 12 (gate insulating film), and has a higher bonding energy than the energy of silicon-hydrogen bonding. By this heat treatment, said element is introduced into only the gate lengthwise direction edge of the gate silicon dioxide film 12, whereby regions 14 being small in initial defect amount are formed as shown in FIG. 2(d). The formation of the region 14 can be also conducted by implantation of ions of the element to be introduced. Further, any other method can also be employed as long as it can introduce an intended element. The size of the region 14 varies depending upon the thickness of the gate silicon dioxide film 12 or the conditions of the subsequent steps and is most appropriately determined so as to achieve the object of the present invention.

Then, side wall spacers 15 are formed as shown in FIG. 2(e), and finally source/drain regions 16 are formed in the silicon substrate 11 as shown in FIG. 2(f).

When the present invention is applied to an ordinary MOSFET, nitrogen is most suitable as the element for reduction in initial defects present in the silicon dioxide film. By introducing nitrogen into the gate lengthwise direction edge of the gate silicon dioxide film, the initial defects present in the silicon dioxide film are terminated. When there are hydrogen-related defects (originating from initial defects), the hydrogen-related defects react with holes when electrical stress (e.g. BT stress) is applied, and a degradation reaction proceeds. Meanwhile, the initial defects terminated with nitrogen, i.e., the silicon-nitrogen bond has a higher bonding energy than the silicon-hydrogen bond has; therefore, the degradation reaction when stress (e.g. BT stress) is applied, is suppressed. Since the degradation reaction is striking locally in the gate lengthwise direction edge of gate silicon dioxide film, the degradation reaction caused by BT stress can be effectively suppressed by introducing nitrogen into the gate lengthwise direction edge of gate silicon dioxide film, and finally the reliability of MOSFET can be secured. Further, since nitrogen is not introduced into other channel region, reduction in current drivability of p-channel MOSFET, caused by nitrogen introduction can be suppressed and the resulting MOSFET can have the same good performance as when a nitrogen-free silicon dioxide film is used as the gate insulating film.

The present invention is described more specifically below by way of Examples. However, the present invention is not restricted to these Examples alone.

EXAMPLE 1

The first example of the present invention is described with reference to FIG. 2.

On a silicon substrate 11 which has been subjected to steps such as device-isolating step, step of implanting an ion into a channel region and the like, is formed a silicon dioxide film 22 of 4 nm in thickness and is deposited polysilicon 21 of 15 nm in thickness as a gate electrode material, as shown in FIG. 2(a) and 2(b). Then, lithography and etching are applied to allow the polysilicon 21 and the silicon dioxide film 22 to remain at only the desired positions, whereby a gate silicon dioxide film 12 and a gate electrode 13 of 0.1 $\mu$m in gate length are formed as shown in FIG. 2(c). Etching of the polysilicon 21 for forming the gate electrode 13 is conducted ordinarily by plasma etching; therefore, the gate lengthwise direction edge of the gate silicon dioxide film 12 undergoes damage caused by plasma or ion and, in the state of FIG. 2(c), has initial defects. In order to reduce the initial defects present in the gate lengthwise direction edge of the gate silicon dioxide film 12, the structure of FIG. 2(c) is subjected to a heat treatment at 850° C. for 30 seconds in an atmosphere of dinitrogen monoxide ($N_2O$), to form nitrogen-containing regions 14 at only the gate lengthwise direction edges of the gate silicon dioxide film, specifically at only a portion of the film ranging from the edge to a point 0.02 $\mu$m or less apart from the edge. By thus introducing nitrogen into the gate silicon dioxide film, the initial defects in the film can be reduced, that is, the initial defects in the gate silicon dioxide film can be terminated with nitrogen. Next, a side wall spacers 15 are formed by the use of a silicon dioxide insulating film. Then, into the whole portion of the structure of FIG. 2(e) is implanted boron difluoride ($BF_2^+$) ion at an acceleration energy of 20 keV at a dose of $3 \times 10^{15}$ cm$^{-2}$, and a heat treatment at 1,000° C. for 10 seconds is applied, whereby the gate electrode 13 is doped and source/drain regions 16 are formed. Subsequently, ordinary wiring and ordinary contact formation are conducted, whereby a p-channel MOSFET is produced.

A MOSFET containing, in the edge of the gate silicon dioxide film, hydrogen-related defects originating from initial defects, cause property fluctuation when BT stress is applied, because the hydrogen-related defects and the holes give rise to a degradation reaction and thereby the hydrogen-related defects are activated electrically. In the MOSFET produced according to the present invention, however, the initial defects are reduced by introduction of nitrogen into the gate lengthwise direction edge of the silicon dioxide film, and the silicon-nitrogen bond formed by the introduction has a higher bonding energy than the silicon-hydrogen bond (hydrogen-related defects) has. As a result, the proceeding of the degradation reaction when BT stress is applied, is suppressed. For example, a conventional p-channel MOSFET having a gate length of 0.25 $\mu$m, when subjected to a BT stress test of allowing the MOSFET to stand at 250° C. for 5 hours while applying an electric field (stress) of 4 MV/cm to the gate silicon dioxide film, shows fluctuation of threshold voltage by at least 100 mV; meanwhile, when the present invention has been applied to the above MOSFET, the fluctuation of threshold voltage can be suppressed to 20 mV or less. Further, according to the present invention, since nitrogen is not introduced into the whole portion of the gate silicon dioxide film but introduced into only the gate lengthwise direction edge of the film, there occurs no reduction in current drivability of p-channel MOSFET. Specifically explaining, in a conventional p-channel MOSFET having a gate silicon dioxide film containing nitrogen in the whole portion of the film, as compared with a p-channel MOSFET having a gate silicon dioxide film containing no nitrogen, there is seen a reduction in current drivability, of about 10% owing to the reduction in hole mobility; meanwhile, in a p-channel MOSFET to which the present invention has been applied, there is seen substantially no reduction in current drivability.

In this example, a heat treatment is conducted in a dinitrogen monoxide ($N_2O$) as a nitrogen source to introduce nitrogen into the edge of the gate silicon dioxide film. The heat treatment may be conducted at a similar degree in other atmosphere such as other nitrogen oxide gas (e.g. NO or $N_2O_3$) or ammonia ($NH_3$). In this example has been described a process for production of a p-channel MOSFET. The present invention may also be applied to production of an n-channel MOSFET by, in the formation of a gate electrode 13 and source/drain regions 16, implanting an ion of an element (e.g. phosphorus or arsenic) which becomes an n-type impurity in silicon. Further in this example has been described a process for production of a MOSFET of single-drain structure wherein formation of source/drain regions 16 is conducted by one time ion implantation and heat treatment. The present invention may also be applied to production of a MOSFET having a lightly doped drain (LDD) region.

EXAMPLE 2

As in Example 1, a polysilicon 21 and a silicon dioxide film 22 are allowed to remain on only the desired positions of a silicon substrate 11, whereby a gate silicon dioxide film 12 and a gate electrode 13 having a gate length of 0.1 μm are formed as shown in FIG. 2(c). In the state of FIG. 2(c), nitrogen ion is implanted vertically at an implantation energy of, for example, 10 keV at an implantation dose of, for example, $1 \times 10^{16}$ cm$^{-2}$, to introduce nitrogen into only the gate lengthwise direction edge of the gate silicon dioxide film 12. Then, doping of the gate electrode 13 and formation of source/drain regions 16 are conducted in the same manner as in Example 1. Subsequently, ordinary wiring and ordinary contact formation are conducted, whereby a p-channel MOSFET is produced. This p-channel MOSFET had excellent properties similarly to the MOSFET of Example 1.

In the above, it is indicated that introduction of nitrogen into the gate lengthwise direction edge of gate silicon dioxide film is effective for securement of MOSFET reliability. In the present invention, the element introduced into the gate lengthwise direction edge of gate silicon dioxide film is not restricted to nitrogen alone and can be any element as long as it has a larger energy of bonding with silicon than the energy of silicon-hydrogen bonding. In a silicon dioxide film consisting of silicon element and oxygen element alone, a large number of dangling bonds, i.e. initial defects are present owing to the disorder of the crystal structure of silicon dioxide. In the present invention, inclusion, in silicon dioxide film, of an element which is different from those constituting the silicon dioxide film, i.e., silicon and oxygen, is thought to contribute to the decrease in amount (concentration) of initial defects.

What is claimed is:

1. A process for producing a semiconductor device, which comprises:

a first step of applying a silicon dioxide insulating film and an electrode material on a semiconductor substrate and removing unnecessary portions of the electrode material to form a gate silicon dioxide film and a gate electrode on the semiconductor substrate and removing the insulating film except underneath the gate electrode, the formed gate silicon dioxide film having at least one lengthwise edge disposed adjacent to the substrate; and a second step of introducing, into only the lengthwise edge in a gate lengthwise direction of the above-formed gate silicon dioxide film, an element which is different from the elements constituting the silicon dioxide film and whose energy of bonding with silicon is larger than the energy of hydrogen-silicon bonding.

2. A process as claimed in claim 1, wherein the element which is different from the elements constituting the silicon dioxide film and whose energy of bonding with silicon is larger than the energy of hydrogen-silicon bonding is nitrogen.

3. A process as claimed in either of claims 1 or 2, wherein the semiconductor device to be produced is a MOS field effect transistor.

4. A process as claimed in claim 1, wherein the introduction of the element which is different from the elements constituting the silicon dioxide film and whose energy of bonding with silicon is larger than the energy of hydrogen-silicon bonding is conducted by heat treating the structure obtained by the first step in a gas atmosphere containing the element.

5. A process as claimed in claim 1, wherein the introduction of the element which is different from the elements constituting the silicon dioxide film and whose energy of bonding with silicon is larger than the energy of hydrogen-silicon bonding is conducted by ion implantation of the element.

* * * * *